United States Patent
Grivna

(10) Patent No.: US 8,247,296 B2
(45) Date of Patent: Aug. 21, 2012

(54) METHOD OF FORMING AN INSULATED GATE FIELD EFFECT TRANSISTOR DEVICE HAVING A SHIELD ELECTRODE STRUCTURE

(75) Inventor: Gordon M. Grivna, Mesa, AZ (US)

(73) Assignee: Semiconductor Components Industries, LLC, Phoenix, AZ (US)

(*) Notice: Subject to any disclaimer, the term of this patent is extended or adjusted under 35 U.S.C. 154(b) by 306 days.

(21) Appl. No.: 12/633,967

(22) Filed: Dec. 9, 2009

(65) Prior Publication Data
US 2011/0136310 A1 Jun. 9, 2011

(51) Int. Cl.
*H01L 21/336* (2006.01)

(52) U.S. Cl. ........ 438/270; 438/589; 438/595; 438/702; 257/E21.41

(58) Field of Classification Search .................. 438/270, 438/454, 589, 595, 700, 702; 257/E21.41
See application file for complete search history.

(56) References Cited

U.S. PATENT DOCUMENTS

| | | | |
|---|---|---|---|
| 4,455,565 A | 6/1984 | Goodman et al. | |
| 4,941,026 A | 7/1990 | Temple | |
| 5,763,915 A | 6/1998 | Hshieh et al. | |
| 5,877,528 A | 3/1999 | So | |
| 5,912,490 A | 6/1999 | Hebert et al. | |
| 5,998,833 A | 12/1999 | Baliga | |
| 6,388,286 B1 | 5/2002 | Baliga | |
| 6,621,121 B2 | 9/2003 | Baliga | |
| 6,764,889 B2 | 7/2004 | Baliga | |
| 6,787,848 B2 | 9/2004 | Ono et al. | |
| 7,005,347 B1 | 2/2006 | Bhalla et al. | |
| 7,183,610 B2 | 2/2007 | Pattanayak et al. | |
| 7,385,248 B2 * | 6/2008 | Herrick et al. | 257/330 |
| 7,446,374 B2 * | 11/2008 | Thorup et al. | 257/330 |
| 7,476,589 B2 * | 1/2009 | Grebs et al. | 438/270 |
| 8,021,947 B2 * | 9/2011 | Grivna et al. | 438/270 |
| 2005/0242392 A1 | 11/2005 | Pattanayak et al. | |
| 2006/0273386 A1 | 12/2006 | Yilmaz et al. | |
| 2006/0281249 A1 * | 12/2006 | Yilmaz et al. | 438/243 |
| 2007/0221952 A1 * | 9/2007 | Thorup et al. | 257/155 |
| 2008/0197407 A1 | 8/2008 | Challa et al. | |

FOREIGN PATENT DOCUMENTS

| | | |
|---|---|---|
| WO | 2005/053031 A2 | 6/2005 |
| WO | 2005/053032 A2 | 6/2005 |
| WO | 2005/112128 A2 | 11/2005 |

OTHER PUBLICATIONS

Ishikawa and Esaki, A High-Power High-Gain VD-MOSFET Operating at 900 MHz, IEEE Transactios on Electron Devices, vol. ED-34, No. 5, pp. 1157-1162, May 1987.

* cited by examiner

*Primary Examiner* — Mary Wilczewski
*Assistant Examiner* — Toniae Thomas
(74) *Attorney, Agent, or Firm* — Kevin B. Jackson

(57) ABSTRACT

A method for forming a transistor having insulated gate electrodes and insulated shield electrodes within trench regions includes forming dielectric stack overlying a substrate. The dielectric stack includes a first layer of one material overlying the substrate and a second layer of a different material overlying the first layer. Trench regions are formed adjacent to the dielectric stack. After the insulated shield electrodes are formed, the method includes removing the second layer and then forming the insulated gate electrodes. Portions of gate electrode material are removed to form first recessed regions, and dielectric plugs are formed in the first recessed regions using the first layer as a stop layer. The first layer is then removed, and spacers are formed adjacent the dielectric plugs. Second recessed regions are formed in the substrate self-aligned to the spacers.

21 Claims, 11 Drawing Sheets

500

500

US 8,247,296 B2

METHOD OF FORMING AN INSULATED GATE FIELD EFFECT TRANSISTOR DEVICE HAVING A SHIELD ELECTRODE STRUCTURE

FIELD OF THE INVENTION

This document relates generally to electronics, and more particularly, to methods of forming semiconductor devices.

BACKGROUND OF THE INVENTION

In the past, the semiconductor industry used different device structures and methods to form insulated gate field effect transistor (IGFET) devices. One particular structure for vertical power IGFET devices used trenches that were formed in an active area of the device. A portion of those trenches were configured as the gate regions of the device. Some of these transistors also had a shield conductor or field plate that was tied to source and configured to assist in improving blocking voltage performance and lowering the gate-to-drain capacitance of the device.

In order for the field plate to favorably impact device performance, very tight geometries are required. Past methods for forming IGFET devices with trench field plates relied on a complex series of process steps, and used thick oxidation layers overlying the trench gate regions to form self-aligned source and body contacts. These thick oxidation layers prevented the use of gate silicide structures, and required the use of thicker epitaxial layers, deeper trenches, and deeper etched contacts. All of these factors reduced the overall manufacturability of the device.

Accordingly, it is desirable to have a scaleable, self-aligned process for forming the device structure, which results in better device performance, reliability, and lower costs.

BRIEF DESCRIPTION OF THE DRAWINGS

For simplicity and clarity of the illustration, elements in the figures are not necessarily to scale, and the same reference numbers in different figures denote the same elements. Additionally, descriptions and details of well-known steps and elements are omitted for simplicity of the description.

Figure 1:
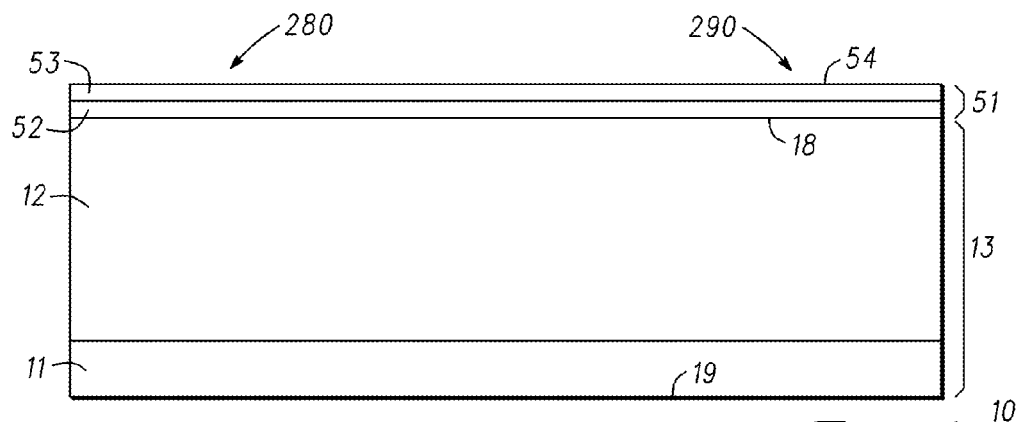
FIGS. 1-4 illustrate partial cross-sectional views of a first embodiment of an IGFET device at early and successive stages of fabrication.

As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor.

Although the devices are explained herein as certain N-channel or P-Channel devices, or certain N-type or P-type doped regions, a person of ordinary skill in the art will appreciate that complementary devices are also possible in accordance with the present invention.

The use of the word approximately or substantially means that a value of an element has a parameter that is expected to be very close to a stated value or position or state. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, although the source is normally shown on the top or upper surface of the device and the drain is normally shown on the bottom or lower surface of the device, such orientation is reversible. Additionally, the drain and source contacts may be on the same or opposite surfaces.

Moreover, the description may illustrate a cellular design (where the body regions are a plurality of cellular regions) or a single body design (where the body region is comprised of a single region formed in an elongated pattern, typically in a serpentine pattern or formed in a plurality of stripes). However, it is intended that the description is applicable to both a cellular implementation and a single base implementation.

DETAILED DESCRIPTION OF THE DRAWINGS

In general, the present description pertains to a method of forming an IGFET semiconductor device or transistor having trench insulated gate electrode and trench insulated shield electrode portions. A disposable dielectric layer comprising a first material is used to form dielectric plugs comprising a different material that overlie the insulated gate electrode portions. The disposable dielectric layer is removed and spacers are formed adjacent the dielectric plugs. Further included is using the spacers to form recessed portions in the transistor to provide contact to source regions and enhancement regions. In one embodiment enhancement regions are formed in the insulated gate electrode portions.

The method enables trench structures that are shallower than prior art structures, enables the use of thinner epitaxial layers, enables the use of gate silicide enhancement regions, and enables smaller geometry configurations without expensive capital investments. Additionally, the method provides a transistor that is easier to manufacture and that has improved performance and reliability.

FIG. 1 shows a partial cross-sectional view of a first embodiment of an IGFET, MOSFET, or transistor 10 at an early step in fabrication. Transistor 10 is formed on or within a body of semiconductor material, semiconductor substrate or substrate 13. In one embodiment, semiconductor substrate 13 includes a bulk semiconductor substrate or bulk substrate 11 that has an epitaxial layer or drift region 12 formed overlying or adjoining one surface of bulk substrate 11. In one embodiment, bulk substrate 11 comprises an n-type silicon substrate having a resistivity in a range from about 0.001 ohm-cm to about 0.005 ohm-cm. In one embodiment, bulk substrate 11 provides a drain contact or a current-carrying contact for transistor 10. Semiconductor substrate 13 includes major surfaces 18 and 19, which oppose each other as shown in FIG. 1.

In one embodiment suitable for a 50 volt device, semiconductor layer 12 is n-type with a dopant or doping concentration of about $1.0\times10^{16}$ to $1.0\times10^{17}$ atoms/cm$^3$ and has a thickness from about 3 microns to about 5 microns. In another embodiment, semiconductor layer 12 may have a graded or stepped doping profile, where the doping concentration is heavier near the bottom of layer 12, and becomes lighter near the top. The thickness and dopant concentration of semiconductor layer 12 is increased or decreased depending on the desired drain-to-source breakdown voltage (BV$_{DSS}$) rating of transistor 10. It is understood that other materials may be used for semiconductor substrate 13 or portions thereof (e.g., portions of semiconductor layer 12 and/or portions of bulk substrate 11) including silicon-germanium, silicon-germanium-carbon, carbon-doped silicon, silicon carbide, semiconductor-on-insulator (SOI), or the like. Additionally, in an alternate embodiment, the conductivity type of bulk substrate 11 or a portion thereof is switched to be opposite the conductivity type of semiconductor layer 12 to form, for example, an insulated gate bipolar transistor (IGBT) embodiment.

For ease of understanding, semiconductor substrate 13 includes an active area generally designated as active area 280 and a termination area generally designated as termination area 290 as shown in FIG. 1. In one embodiment, a body region or p-type high voltage region is formed at this early step in fabrication using conventional photolithographic and doping techniques. In another embodiment, the body region is formed in the step generally described with FIG. 11. In the embodiment described herein, the body region is formed in the step described generally with FIG. 13 below.

A dielectric stack, disposable dielectric stack, dielectric structure, or insulated stack 51 is formed overlying major surface 18, and in the embodiment shown includes dielectric layer or disposable dielectric layer 52 and dielectric layer or disposable dielectric layer 53, which are different materials. Specifically, dielectric layers 52 and 53 etch at different rates in a given etchant chemistry. That is, the layers have selectivity with respect to each other. In one embodiment, dielectric layer 52 is an oxide film, and has a thickness from about 0.1 microns to about 0.3 microns. In one embodiment, dielectric layer 52 is formed using thermal oxidation (i.e., wet oxidation or steam oxidation) techniques. In an alternative embodiment, dielectric layer 52 is formed using a chemical vapor deposition (CVD) process.

Preferably, dielectric layer 53 is an oxidation blocking film. That is, a film that does not readily oxidize. In one embodiment, dielectric layer 53 is a nitride film, and has a thickness from about 0.1 microns to about 0.3 microns. Dielectric layer 53 is formed using conventional techniques such as plasma enhanced or low pressure CVD process techniques. It is understood that dielectric stack 51 may include additional dielectric films. For example, a hard mask layer such as a deposited oxide may be formed overlying dielectric layer 53. Dielectric stack 51 includes a major, upper, or first surface 54 as shown in FIG. 1.

Figure 2:
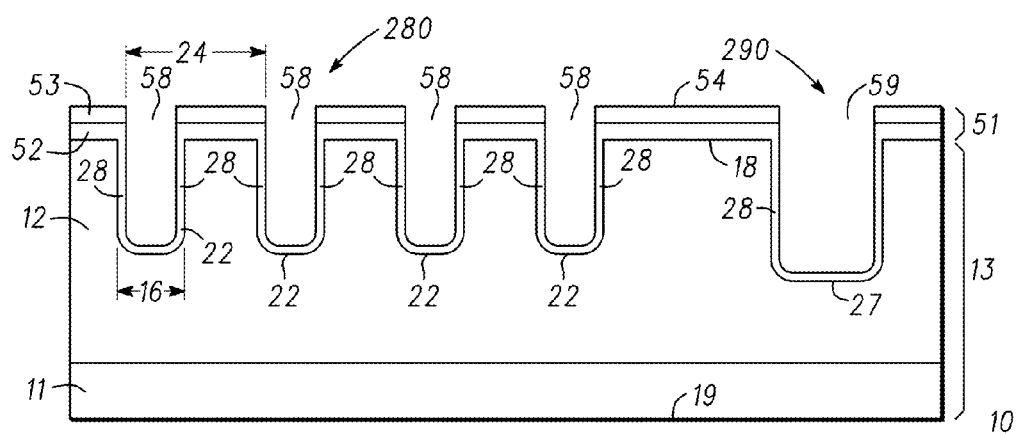

FIG. 2 shows transistor 10 at a subsequent step in its fabrication. A conventional photolithographic step and an etch step are used to form openings, vias or windows 58 and 59 overlying major surface 18. Openings 58 and 59 extend through dielectric stack 51. Openings 58 correspond to locations where trench structures are to be formed in semiconductor substrate 13 in active area 280, and opening 59 corresponds to a location where a contact structure is to be formed in termination or edge area 290. In the embodiment shown, the contact structure is for making contact to the insulated shield electrodes. Also, a contact structure for making contact to the insulated gate electrodes can be formed in termination area 290 as shown, for example, in FIG. 16. Openings 58 and 59 expose portions or segments of major surface 18. By way of example, openings 58 are about 0.25 microns to about 0.35 microns wide, and opening 59 is about 0.6 microns wide. In an optional embodiment, spacers are formed in openings 58 and 59 to reduce undercutting of dielectric layer 52. For example, nitride spacers are used.

After openings 58 and 59 are formed, the exposed segments of semiconductor substrate 13 are etched to form trenches 22 and 27 extending from major surface 18. By way of example, trenches 22 and 27 are formed using plasma etching techniques with a fluorocarbon chemistry (e.g., $SF_6$/$O_2$). At this point in the process in accordance with the first embodiment, trenches 22 and 27 are etched to a first or an initial depth. By way of example, this initial depth is about 0.8 microns to about 2.5 microns. By way of example, transistor 10 has a pitch dimension 24 from about 0.7 microns to about 1.2 microns.

After trenches 22 and 27 are formed, a sacrificial oxide layer is formed overlying exposed surfaces of semiconductor substrate 13 in trenches 22 and 27. This step is used, for example, to clean-up the exposed surfaces. By way of example, a thermal oxide of about 0.08 microns is formed. Subsequently, the sacrificial oxide is removed. A dielectric layer 28 is then formed overlying exposed sidewall and lower surfaces of semiconductor substrate 13 in trenches 22 and 27. In one embodiment, dielectric layer 28 is configured as a gate dielectric film or layer, and is a thermal oxide having thickness from about 0.01 microns to about 0.1 microns. Dielectric layer 28 and trench 22 (i.e., the first portion of trench 22 as shown in FIG. 2) stage have a lateral dimension 16. One feature of this step is that the gate dielectric layer is formed and the gate length for transistor 10 is established early in the process sequence, which, among other things, is beneficial to protect the critical dielectric-semiconductor material interface. In an alternative embodiment, the sacrificial oxide layer described above is left in place and used in the process sequence described below, and the gate dielectric layer is formed at a later step.

Figure 3:
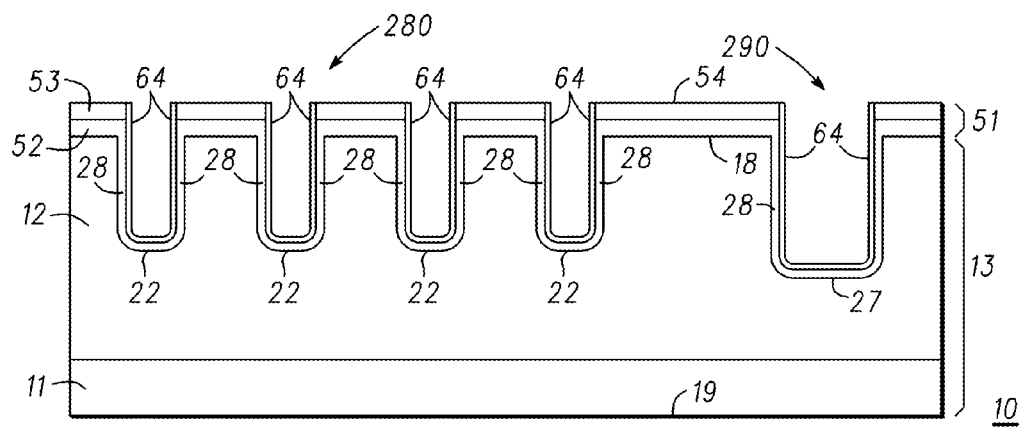

FIG. 3 shows transistor 10 after additional processing. A dielectric layer 64 then is formed overlying dielectric layer 28 and sidewalls of dielectric stack 51. Preferably, dielectric layer 64 is made from a different material than dielectric layer 28. In one embodiment, dielectric layer 64 comprises a nitride layer, and has a thickness of about 0.025 microns. In an alternative embodiment, a polycrystalline semiconductor layer is first formed overlying dielectric layer 28 and sidewalls of dielectric layer 52 before forming dielectric layer 64. By way of example, a polysilicon layer about 0.025 microns thick may be used. In an alternative embodiment, dielectric layer 28 is selectively removed from the bottom portions of trenches 22, and then dielectric layer 64 is deposited over dielectric layer 28 remaining on the sidewalls of trenches 22 and over exposed semiconductor layer 12 at the bottom portions of trenches 22.

Figure 4:
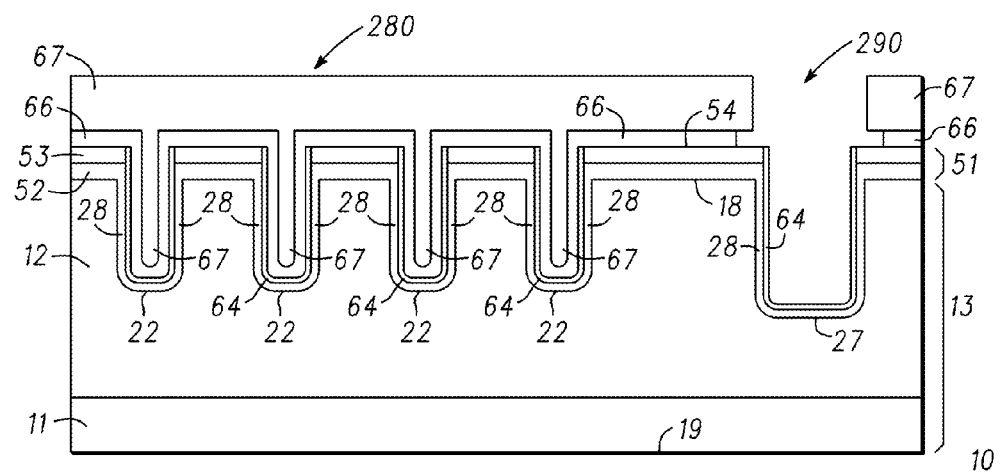

FIG. 4 shows transistor 10 after further processing. A dielectric layer 66 is formed overlying semiconductor substrate 13, and comprises, for example, about 0.03 microns of deposited oxide. A photoresist layer 67 is then formed overlying semiconductor substrate 13 and patterned to expose segments of termination area 290 including trench 27. The exposed oxide is then selectively removed stopping on dielectric layer 64.

Figure 5:
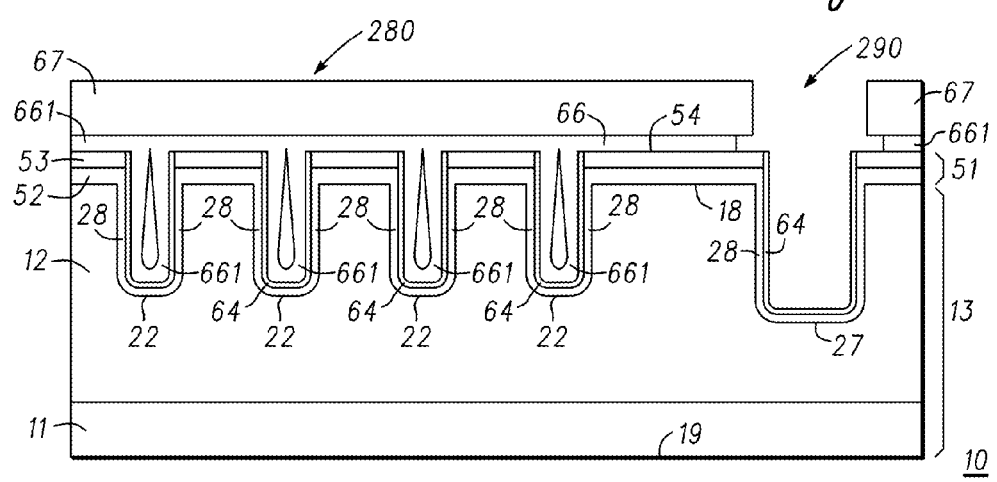
FIG. 5 illustrates a partial cross-sectional view of an alternative method step for forming the intermediate structure shown in FIG. 4.

FIG. 5 shows transistor 10 in accordance with an alternative step to the step described in FIG. 4. In this alternative step, a dielectric layer 661 is formed overlying substrate 13, and comprises, for example, about 0.15 microns of deposited oxide such as a plasma enhanced chemical vapor deposited (PECVD) phosphosilicate glass (PSG). This alternative step is preferred if photoresist coating issues are a problem. Photoresist layer 67 is then formed overlying semiconductor substrate 13 and then patterned to expose segments of termination area 290 including trench 27.

Figure 6:
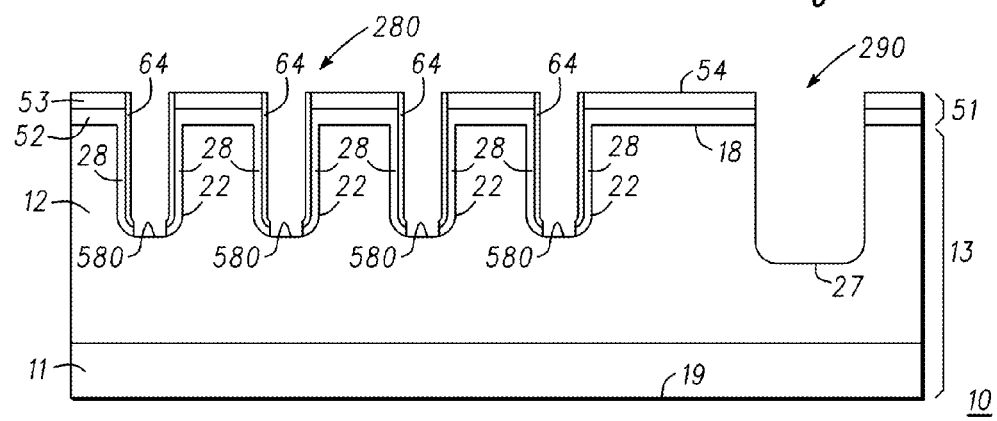
FIGS. 6-15 illustrate partial cross-sectional views of the IGFET device during subsequent steps of fabrication.

FIG. 6 shows transistor 10 after still further processing. Photoresist layer 67 is removed, and then dielectric layer 64 is removed from trench 27 using the remaining portions of dielectric layer 66 (or 661) as a hard mask. Next, dielectric layer 66 (or 661) is removed together with dielectric layer 28 from trench 27. This step exposes sidewall and lower surfaces of trench 27. This step may also thin portions of dielectric layer 53 in termination area 290 adjacent to trench 27.

Figure 7:
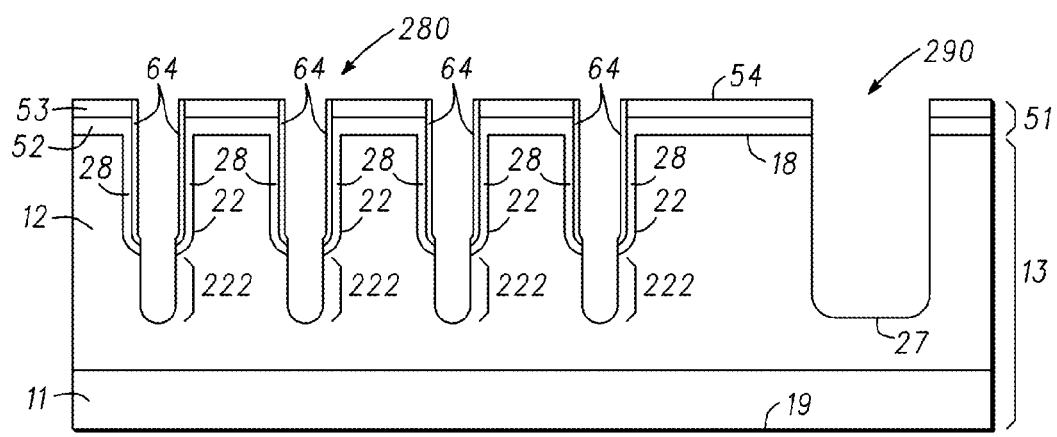

An anisotropic dry etch is used to remove segments of dielectric layer 64 and dielectric layer 28 from lower surfaces of trenches 22 to form openings 580 while leaving other segments of dielectric layer 64 overlying dielectric layer 28 along the sidewall portions of trenches 22. Trenches 22 and 27 are then etched deeper into semiconductor substrate 13 using, for example, a dry etch step with a fluorocarbon chemistry to form shield electrode trench portions 222 as shown in FIG. 7. Trench portions 222 are formed through openings 580 self-aligned to dielectric layer 64. In one embodiment, trenches 22 and 27 are etched to a target depth of about 1.5 to about 1.8 microns.

Figure 8:
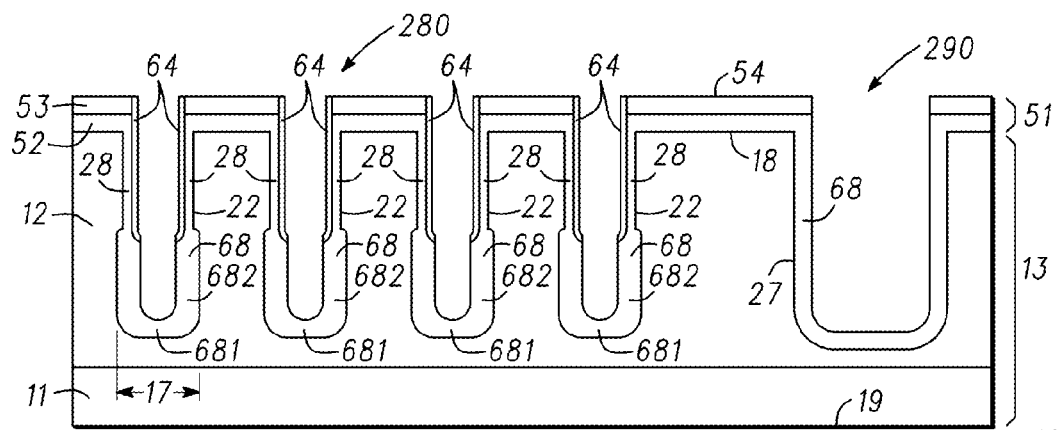

FIG. 8 shows transistor 10 after further processing. A dielectric layer, shield electrode insulating layer or field electrode insulating layer 68 is then formed along lower portions of trenches 22 (i.e., along shield electrode trench portions 222) and along surfaces of trench 27. In one embodiment, dielectric layer 68 is a thermal oxide about 0.2 microns thick. Also, in this embodiment dielectric layer 68 is thicker than dielectric layer 28, which results in lateral dimension 17 being greater than lateral dimension 16 (shown in FIG. 2). In an optional embodiment, a sacrificial oxide is first formed and stripped before forming dielectric layer 68. In a still further embodiment, lower portion 681 of dielectric layer 68 is formed to be thicker than side portions 682 of dielectric layer 68. The process sequence just described allows the subsequently formed insulated shield electrodes to be wider than the insulated gate electrodes in the resultant transistor, which narrows the distance between adjacent insulated shield electrodes. This provides for tighter geometries without having to use expensive photolithographic techniques.

Figure 9:
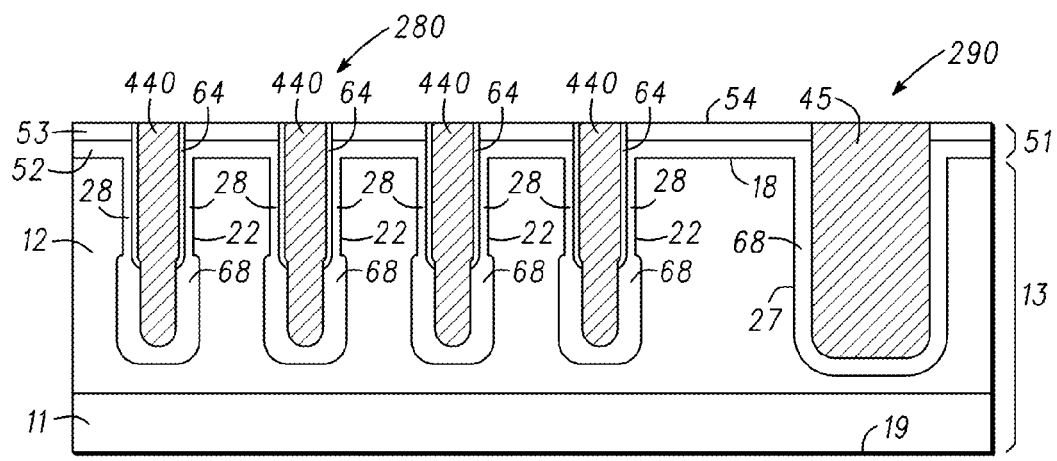
Figure 10:
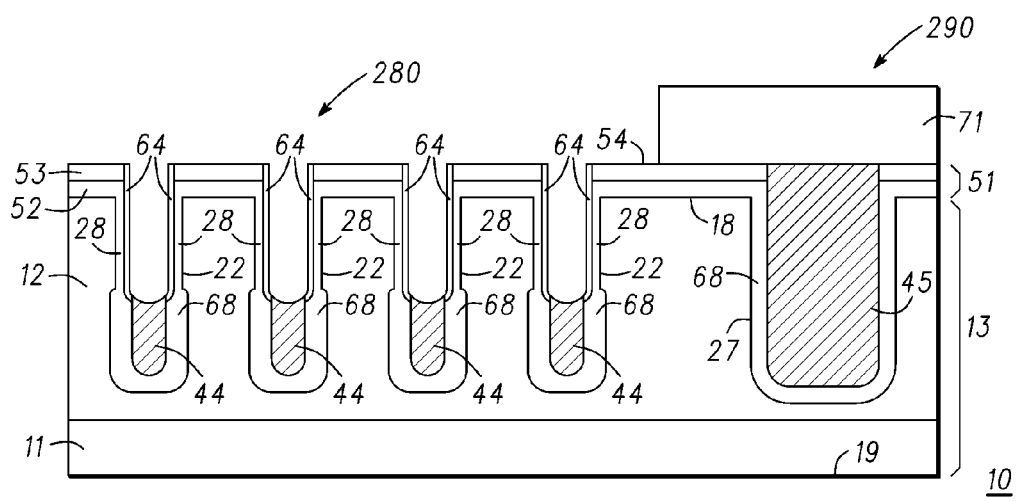

FIG. 9 shows transistor 10 after additional processing. A conductive layer is deposited overlying semiconductor substrate 13. In one embodiment, the conductive layer is polysilicon doped with an n-type dopant such as phosphorous. In an alternate embodiment, the conductive layer is a metal, silicide, or combinations thereof including combinations with polysilicon. The conductive layer is then planarized or etched back in proximity to surface 54 of dielectric stack 51 to form conductive trench fill layers 440 in trenches 22 and a field electrode contact layer or region 45 in trench 27. Either an etch back step or a chemical mechanical polishing or planarization (CMP) step is used. Next, a photoresist layer is deposited and patterned to form a protective layer 71 overlying termination area 290 including trench 27 as shown in FIG. 10. The conductive trench fill layers 440 are then partially etched-back and recessed within lower portions of trenches 22 leaving shield electrodes, conductive shield electrodes, or field electrodes 44 overlying dielectric layers 68 in lower portions of trenches 22. A dry etch process with fluorocarbon, chlorine, or bromine chemistries being suitable for this step. Shield electrodes 44 and dielectric layers 68 together with dielectric layer 74 (shown in FIG. 11) form insulated field electrodes or insulated shield electrodes 70 (also shown in FIG. 11) for transistor 10. The process sequence as described herein beneficially allows insulated shield electrodes 70 to be wider than the subsequently formed insulated gate electrodes, which narrows the distance between adjacent insulated shield electrodes. This provides for tighter geometries without having to use expensive photolithographic techniques.

Figure 11:
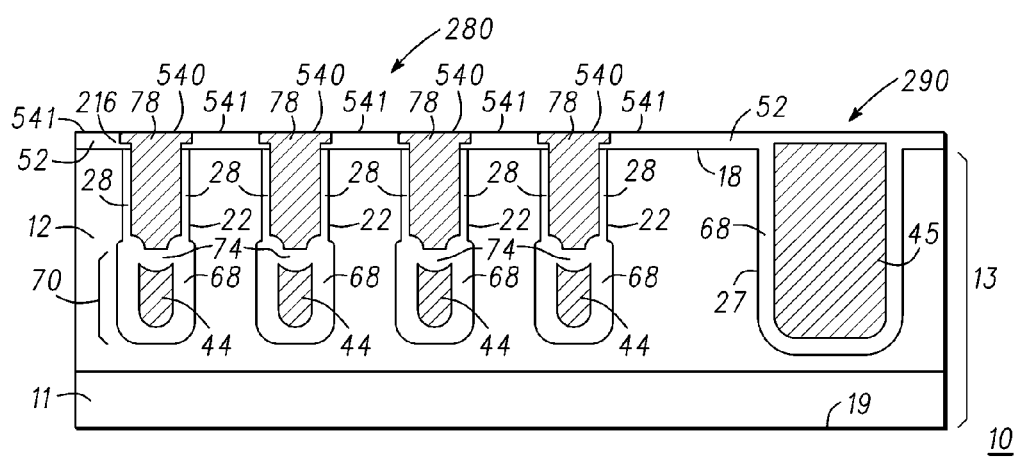

FIG. 11 shows transistor 10 after additional processing. Dielectric layer or shield electrode insulating layer 74 is first formed overlying shield electrodes 44 and conductive shield electrode contact region 45 (shown generally as part of dielectric layer 52). In one embodiment, dielectric layer 74 is an oxide such as thermal oxide, and has a thickness of about 0.1 microns. Dielectric layer 64 is then removed from sidewall segments of trenches 22 and dielectric layer 53 is removed from dielectric stack 51 using, for example, a selective etch. In an optional step, additional material is added to dielectric layer 28 using, for example, a re-oxidation step.

A conductive layer is then formed overlying semiconductor substrate 13 and overlying insulated shield electrodes 70 within trenches 22. In one embodiment, the conductive layer is polysilicon, and in the present embodiment is doped with an n-type dopant such as phosphorous. In an alternate embodiment, the conductive layer is a metal, silicide or combinations thereof including combinations with polysilicon. Portions of the conductive layer are then removed to form or provide conductive gate material, electrodes or layers 78 within trenches 22. In the present embodiment, the conductive layer is then planarized so that upper surfaces 540 of conductive gate electrodes 78 are in proximity to upper surface 541 of dielectric layer 52. In this embodiment, dielectric layer 52 is used as a stop-layer when planarizing the conductive layer. An etch-back step or a CMP step is used for this planarization step. Conductive gate electrodes 78, dielectric layer 28, and dielectric layer 74 form insulated gate electrodes 80 for transistor 10.

Figure 12:
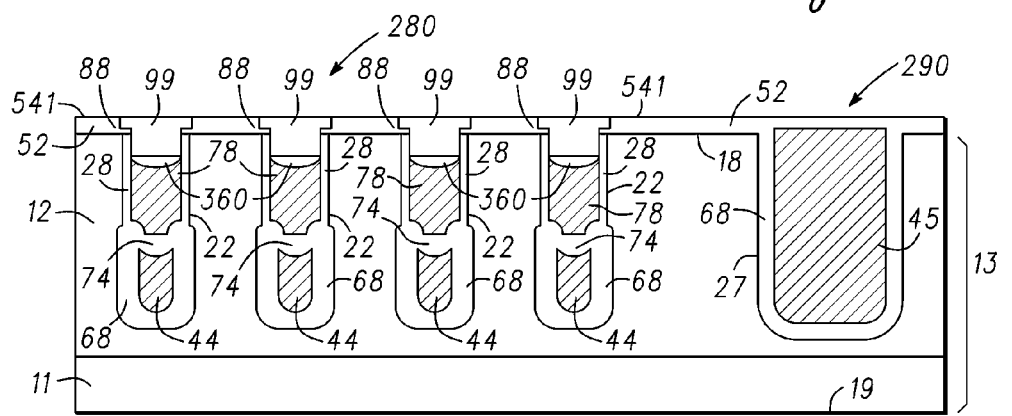

FIG. 12 shows transistor 10 at a later step in fabrication. In accordance with the present embodiment, a dry or wet etch step is used to remove portions of gate electrodes 78 adjacent to dielectric layer 52 to form recessed portions or vias 88. In one embodiment, recessed portions 88 extend below major surface 18. In one embodiment, an enhancement region 360 is formed in conductive gate electrodes 78 in recessed portions 88. Enhancement regions 360 can include temperature tolerant silicides such as tungsten, tantalum, or cobalt silicides. Next, in accordance with the present embodiment, dielectric caps or plugs or dielectric plug regions 99 are formed within recessed portions 88 and adjacent enhancement regions 360. Plugs 99 preferably are formed with a material that is different than the material of dielectric layer 52. That is, the materials have selectivity with respect to each other. When dielectric layer 52 is an oxide, plugs 99 preferably are a nitride. In one embodiment, a CVD nitride layer about 0.2 microns to about 0.25 microns thick is formed overlying semiconductor substrate 13 to fill recessed portions or vias 88. The nitride layer is then planarized using dielectric layer 52 as a stop-layer to form dielectric plugs 99 within recessed portions 88. As shown in FIG. 12, the re-oxidation step described in conjunction with FIG. 11, which results in dielectric layer 52 having stepped profile adjacent vias 88, plugs 99 are formed with a "T" or flared-outward shape.

Figure 13:
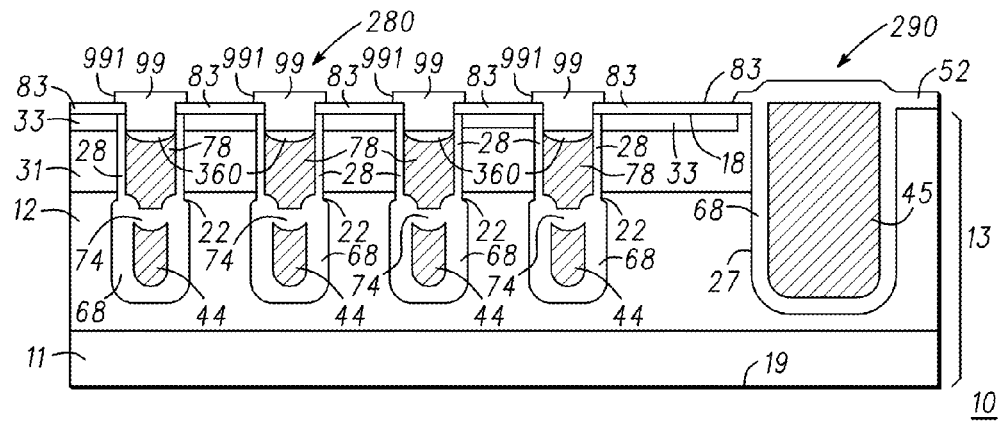

FIG. 13 shows transistor 10 after still further processing. A body region or p-type high voltage (PHV) region 31 is formed in an active portion 280 of semiconductor substrate 13. As described herein, body region 31 is referred to in the singular, but it is understood that the body region may be a plurality of individual regions or cells. Body region 31 has a conductivity type that is opposite to the conductivity type of semiconductor layer 12. In this example, body region 31 is p-type conductivity. Body region 31 has a dopant concentration suitable for forming inversion layers that operate as conduction channels or channel regions of transistor 10. Body region 31 extends from major surface 18 to a depth, for example, from about 0.5 microns to about 2.0 microns. Conventional photolithographic and ion implantation techniques are used to form body region 31 in select or desired areas, portions or regions of semiconductor substrate 13.

A photoresist layer (not shown) that is used to form body region 31 is left in place overlying termination region 290, and disposable dielectric layer 52 in active region 280 is removed. The removal of dielectric layer 52 exposes sidewalls or side portions 991 of plugs 99 as shown in FIG. 13. The amount of undercutting below plugs 99 during the removal of dielectric layer 52 preferably is minimized. The photoresist layer is then removed, and a screen dielectric layer 83 is then formed over segments of major surface 18 between trenches 22. In one embodiment, screen dielectric layer 83 is an oxide formed using thermal oxidation techniques, and has a thickness of about 0.05 microns. When a thermal oxide is used, screen dielectric layer 83 does not form over plugs 99 when plugs 99 are a nitride material.

Next, n-type source regions, current conducting regions, or current carrying regions 33 are formed within, in, or overlying body region 31 and extend from major surface 18 to a depth, for example, from about 0.1 microns to about 0.5 microns. In accordance with the present embodiment, source regions 33 are self-aligned to plugs 99. A phosphorous or arsenic ion implant dose of about $3.0 \times 10^{15}$ atoms/cm$^2$ and an implant energy sufficient to allow the dopant to penetrate screen dielectric layer 83 is used to form source regions 33. The implanted dopant is then annealed at this point or during subsequent processing.

Figure 14:
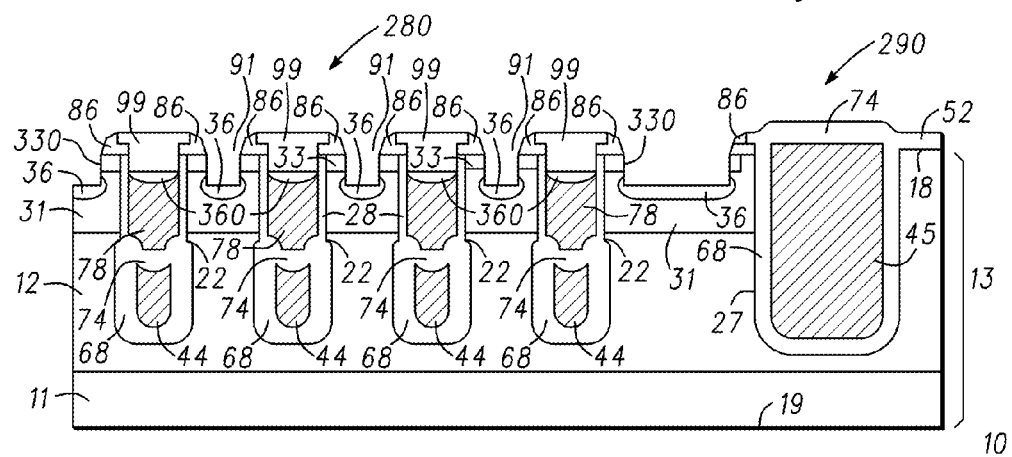

FIG. 14 shows transistor 10 after additional processing. A dielectric layer is formed overlying semiconductor substrate 13 and along or adjacent sidewalls 991 of plugs 99. Preferably, the dielectric layer and plugs 99 are made from different materials. The dielectric layer is then anisotropically etched to form spacers 86 next to or adjacent to plugs 99. This etch step also exposes segments of major surface 18 between adjacent trenches 22. In one embodiment, when plugs 99 are a nitride material the dielectric layer is a deposited oxide layer with a thickness of about 0.1 microns to about 0.2 microns.

In accordance with the present embodiment, a dry etch step is used to remove portions of semiconductor substrate 13 self-aligned to spacers 86 to form recessed portions 91 within semiconductor substrate 13 or specifically within body region 31. Recessed portions 91 extend into body region 31 exposing surfaces 330 of source regions 33. In one embodiment, recessed portions 91 are formed using a dry etch process with an $SF_6/O_2$ chemistry. Alternatively, an HBr/Cl chemistry is used.

P-type dopant is then ion implanted into body region 31 through recessed portions 91 to form contact enhancement regions 36. In one embodiment, a boron ion implant or a series of boron ion implants is/are used to form contact enhancement regions 36. By way of example when a single implant is used, an implant dose of about $1.0 \times 10^{14}$ atoms/cm$^2$ to about $2.0 \times 10^{15}$ atoms/cm$^2$ is used. Next, the implanted dopant is annealed.

Figure 15:
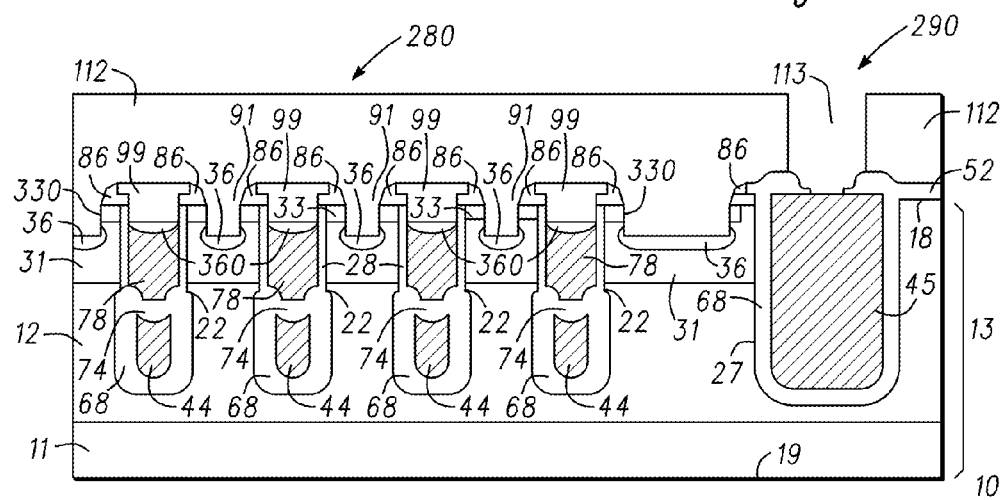
Figure 16:
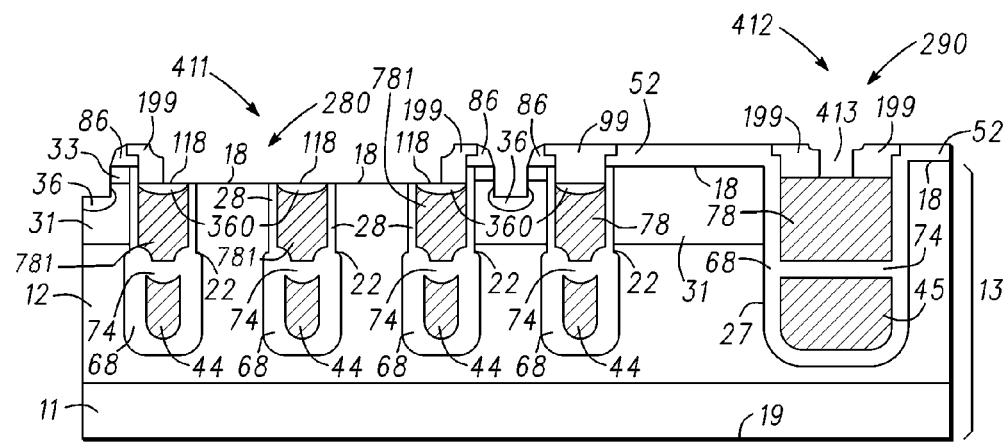
FIG. 16 illustrates a partial cross-sectional view of another portion of the IGFET device at an intermediate step.

Next, a photoresist layer 112 is formed overlying semiconductor substrate 13 and patterned to expose portions of dielectric layer 52 overlying shield conductive electrode 45 as shown in FIG. 15 (and to expose a portion of gate contact structure 412, which is shown in FIG. 16). The exposed portion of dielectric layer 52 is then etched to provide a contact window 113 to shield conductive electrode 45.

FIG. 16 shows another portion of transistor 10 at an intermediate step in fabrication. In this view, transistor 10 includes an optional Schottky structure 411 formed in active portion 280 and a gate contact structure 412 formed, for example, in termination area 290. In a preferred embodiment, a plurality of Schottky structures 411 are interspersed with IGFET devices in transistor 10. Schottky structure 411 includes a plurality of adjacent trenches 22 each with an insulated shield electrode 70 and a partially insulated gate electrode 81, which includes a conductive layer 781 similar to gate conductive layer 78. In the preferred embodiment, Schottky structure 411 is bounded at the edges by etched caps or plugs or partial caps or plugs 199, which are formed at the same time as plugs 99. As shown in FIG. 16, upper surfaces 118 of insulated gate electrodes 81 are exposed, and Schottky structure 411 is formed without body region 31 or source regions 33. When contact structure 71 (shown in FIG. 13) is formed, contact structure 71 forms a Schottky contact with major surface 18 in Schottky structure 411. Additionally, contact structure 71 makes contact to conductive layer 781 and enhancement region 360. Conductive layers 781 preferably are not connected to gate conductive layers 78.

Gate contact structure 412 includes conductive layer 78, which is connected to gate conductive layers 78 in trenches 22. Partial plugs 199, which are formed at the same time as plugs 99, provide a bounded contact window 413 for contact between a gate pad 711 (shown in FIG. 19) and gate conductive layer 78

Figure 17:
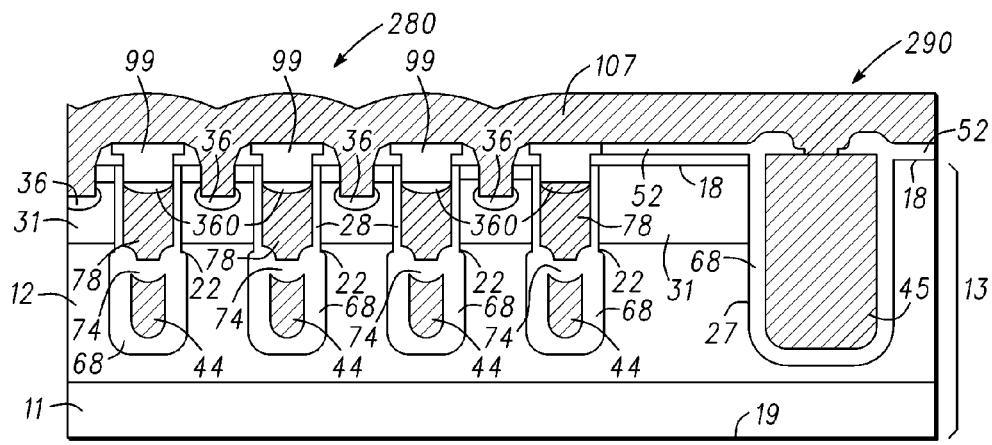
FIGS. 17-19 illustrate partial cross-sectional views of the IGFET device during subsequent steps of fabrication.
Figure 19:
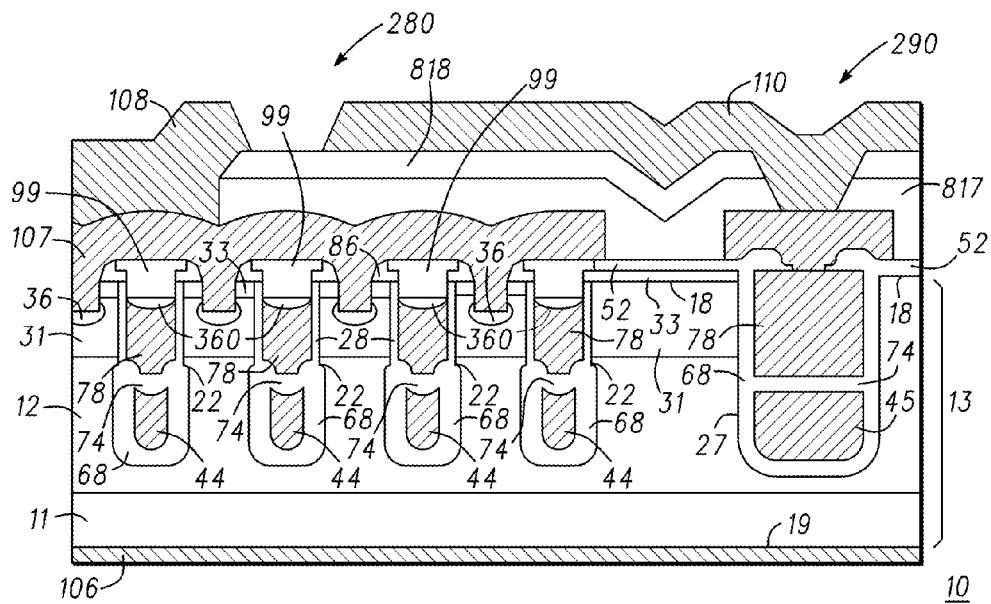

FIG. 17 shows transistor 10 after additional processing. A conductive layer is formed overlying semiconductor substrate and patterned using conventional photolithographic and etch techniques to form conductive layer or contact structure 107 connected to source regions 33 and enhancement regions 36, and in one embodiment, connected to shield electrode contact layer 45. This step also forms conductive layer 109 in contact with gate contact structure 412 as shown in FIG. 19. In one embodiment, conductive layer 107 (and 109) includes a contact/barrier structure such as titanium/titanium-nitride structure, and a metal layer overlying the contact/barrier structure such as aluminum or an aluminum alloy. In another embodiment conductive plug regions are formed between the contact/barrier structure and the metal layer. By way of example, the conductive plug regions are formed from planarized tungsten. Contact structure 107 is configured as a source contact or major current carrying electrode, and provides electrical contact to source regions 33, field electrode contact region 45, and indirectly to shield electrodes 44. In one embodiment, conductive layer 107 makes direct contact to or is directly on upper surfaces of plugs 99 as shown in FIG. 17 without an intervening inter-layer dielectric (ILD) layer. This reduces topography variation and reduces processing costs.

Figure 18:
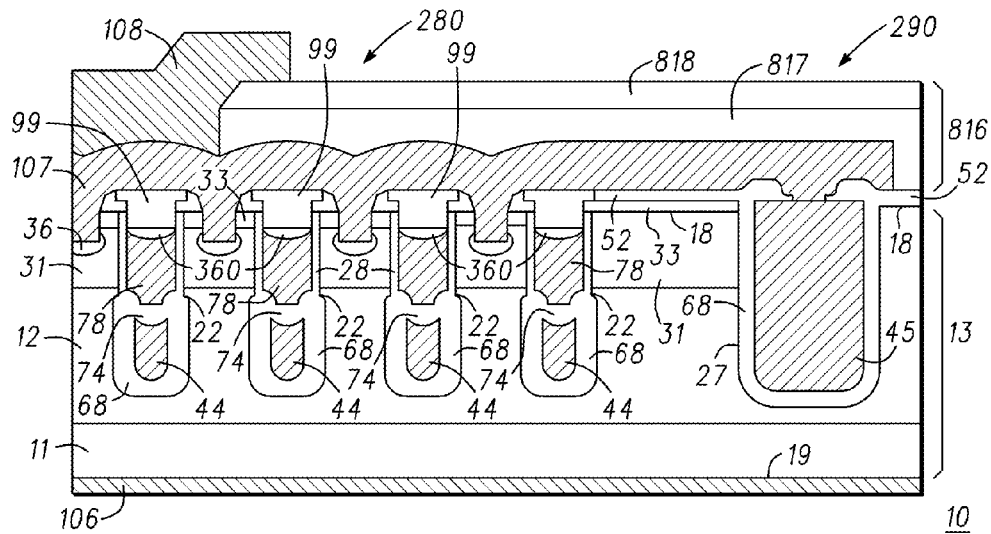

In one embodiment, a passivation structure 816 is formed overlying semiconductor substrate 13 as shown in FIG. 18. In one embodiment, passivation structure 816 includes a dielectric layer 817 and a dielectric layer 818. In one embodiment dielectric layer 817 is a deposited oxide such as a PSG oxide, and has a thickness of about 0.3 microns to about 0.5 microns. In one embodiment, dielectric layer 818 is a deposited nitride, and has a thickness of about 0.8 microns. Next, a conventional photolithographic and etch step is used to form contact vias or windows in passivation structure 816 to expose at least portions of conductive layers 107 and 109 (shown in FIG. 19). Another conductive layer is then formed overlying semiconductor substrate and patterned using conventional photolithographic and etch techniques to form conductive layers 108 and 110 (shown in FIG. 19). In one embodiment, conductive layers 108 and 110 are aluminum or an aluminum alloy. Conductive layer 108 is configured as a second level metal layer and is connected to conductive layer 107. Conductive layer 110 is configured as a gate pad, and as shown in FIG. 19, conductive layer or gate pad 110 is formed at least partially over active region 280. A contact layer 106 is further formed overlying major surface 19 and is a metal layer such as Ti/Ni/Ag, Cr/Ni/Au, or the like. In transistor 10, contact layer 106 is configured as a drain contact or drain electrode. In another embodiment, the drain contact is made on major surface 18.

In one embodiment, the operation of transistor 10 proceeds as follows. Assume that source electrode (or input terminal) 108/107 and shield electrodes 44 are operating at a potential $V_S$ of zero volts, gate electrodes 78 receive a control voltage $V_G$ of 2.5 volts through gate pad 110, which is greater than the conduction threshold of transistor 10, and drain electrode (or output terminal) 106 operates at a drain potential $V_D$ of 5.0 volts. The values of $V_G$ and $V_S$ cause body region 31 to invert adjacent conductive gate electrodes 78 to form channels, which electrically connect source regions 33 to semiconductor layer 12. A device current $I_{DS}$ flows from drain electrode 106 and is routed through semiconductor layer 12, the channels, and source regions 33 to source electrode 107/108. In one embodiment, $I_{DS}$ is on the order of 1.0 amperes. To switch transistor 10 to the off state, a control voltage $V_G$ of less than the conduction threshold of transistor 10 is applied to gate electrodes 78 (e.g., $V_G$<2.5 volts). This removes the channels and $I_{DS}$ no longer flows through transistor 10.

Shield electrodes 44 are configured to control the width of the depletion layer between body region 31 and semiconductor layer 12, which enhances source-to-drain breakdown voltage. Also, shield electrodes 44 help reduce gate-to-drain charge of transistor 10. Additionally, because there is less overlap of conductive gate electrodes 78 with semiconductor layer 12 compared to other structures, the gate-to-drain capacitance of transistor 10 is reduced. These features further enhance the switching characteristics of transistor 10.

Figure 20:
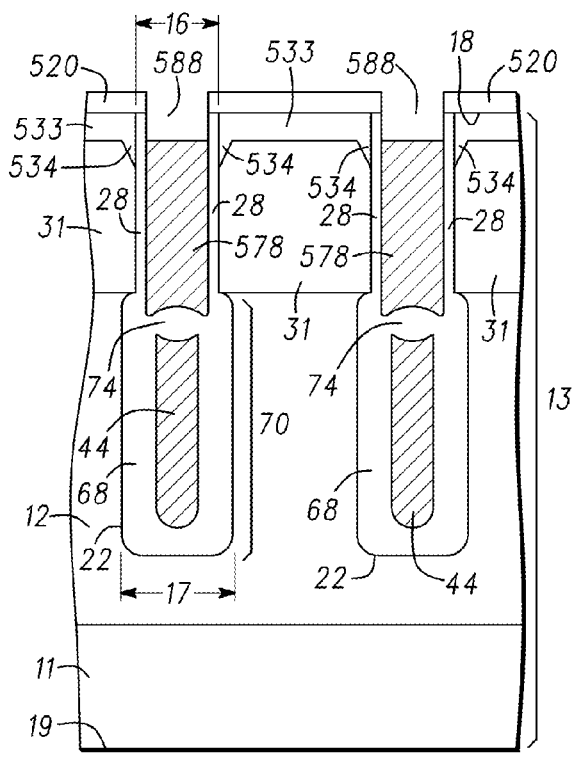
FIGS. 20-23 illustrate partial cross-sectional views of a second embodiment of an IGFET device during intermediate and subsequent steps of fabrication.

FIGS. 20-23 show a method for forming another embodiment of an IGFET, MOSFET, or transistor 500 at an intermediate step and subsequent steps in fabrication. Transistor 500 is similar to transistor 10 as evidenced by common element numbers. Similar to the method used to form transistor 10, the method for forming transistor 500 has several features. For example, the gate dielectric layer is formed early in the process, which establishes the gate length of transistor 500, which among other things, is beneficial to protect the critical dielectric-semiconductor material interface. Also, the process allows insulated shield electrodes 70 to be wider than the insulated gate electrodes (i.e. lateral dimension 17 is greater than lateral dimension 16 as shown in FIG. 20), which narrows the distance between adjacent insulated shield electrodes. This provides for tighter geometries without having to use expensive photolithographic techniques.

In this embodiment, dielectric layer 520 is similar to dielectric layer 52, except that dielectric layer 520 is thinner. By way of example, dielectric layer 520 is an oxide with a thickness of about 0.05 microns to about 0.075 microns. After insulating layer 74 is formed overlying shield electrodes 44, a conductive layer is then formed overlying semiconductor substrate 13 and overlying insulated shield electrodes 70 within trenches 22. In one embodiment, the conductive layer is polysilicon, and in the present embodiment is doped with an n-type dopant such as phosphorous. In alternative embodiment, the conductive layer is a metal, silicide or combinations thereof including combinations with polysilicon. The conductive layer is then planarized using, for example, dielectric layer 520 has a stop-layer to form gate electrodes 578. An etch-back step or CMP is used for this step. Next, a dry or wet etch step is used to remove portions of gate electrodes 578 to form recessed portions or vias 588. In one embodiment, recessed portions 588 extend below major surface 18.

Next, a photoresist layer (not shown) is formed overlying semiconductor substrate 13 and patterned in preparation of forming source regions 533. A phosphorous or arsenic ion implant dose of about $3.0\times10^{15}$ atoms/cm$^2$ and an implant energy sufficient to allow the dopant to penetrate dielectric layer 520 is used to form source regions 533. The presence of recessed portions 588 and implant scattering result in source regions 533 having extended portions or vertical source extensions 534, which beneficially ensure sufficient overlap between gate electrodes 578 and source regions 533. The photoresist layer is then removed, and the implanted dopant is annealed at this point or during subsequent processing.

Figure 21:
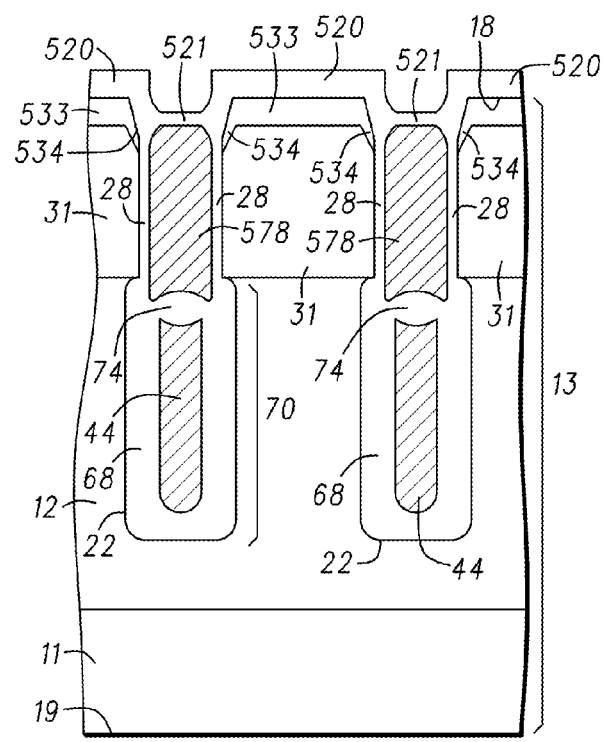
Figure 22:
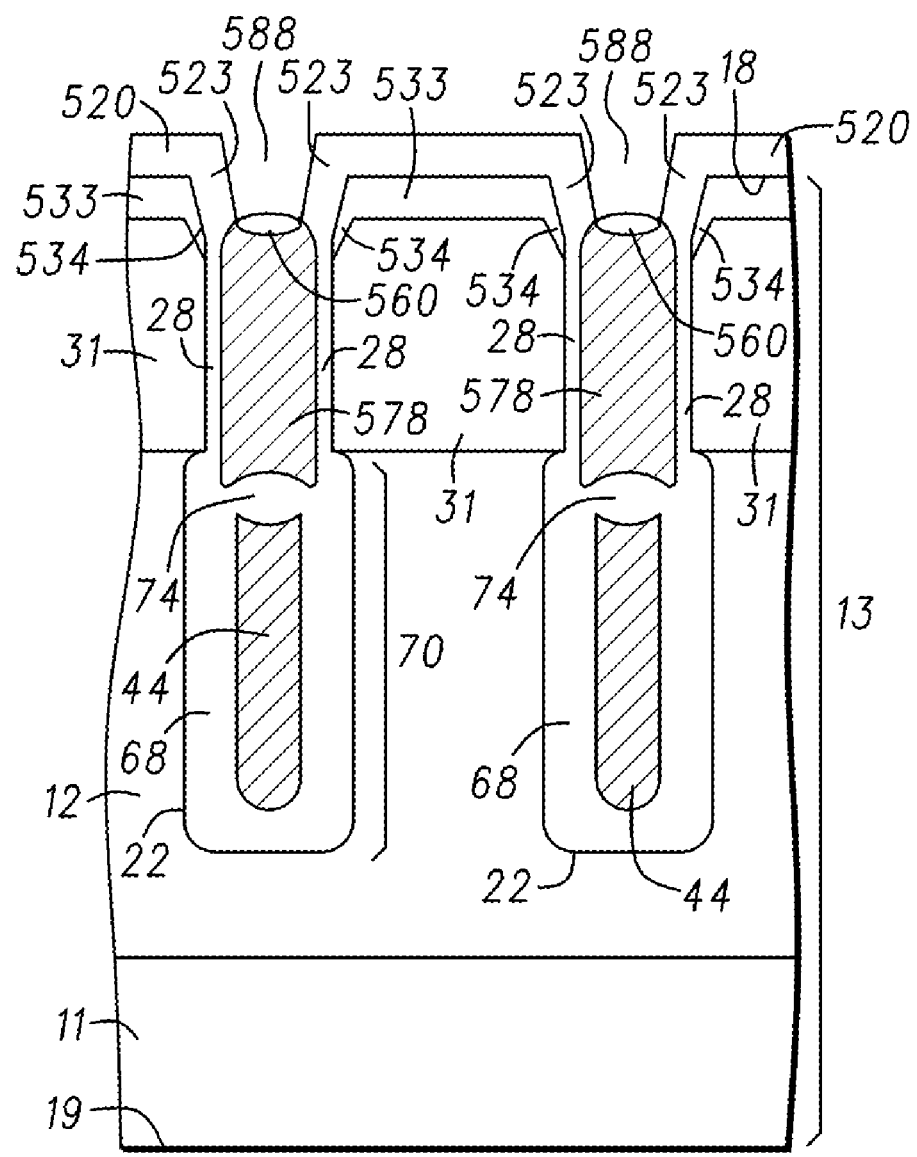

In an optional step, a low temperature wet oxide is used to increase the thickness of dielectric layer 520 and to form a dielectric layer 521 overlying gate electrodes 578 as shown in FIG. 21. By way of example, a wet oxide formed at about 850 degrees Celsius is used. Next, a dry etch step is used to remove portions of dielectric layer 521 and to form spacers 523 along sidewalls of recessed portions 588 as shown in FIG. 22. Enhancement regions 560 are then formed in portions of gate electrodes 578 self-aligned to spacers 523. By way of example, enhancement regions 560 are self-aligned silicide regions such as cobalt or titanium silicides or the like. In an alternative embodiment, enhancement regions 560 are formed within gate electrodes 578 without spacers 523.

Figure 23:
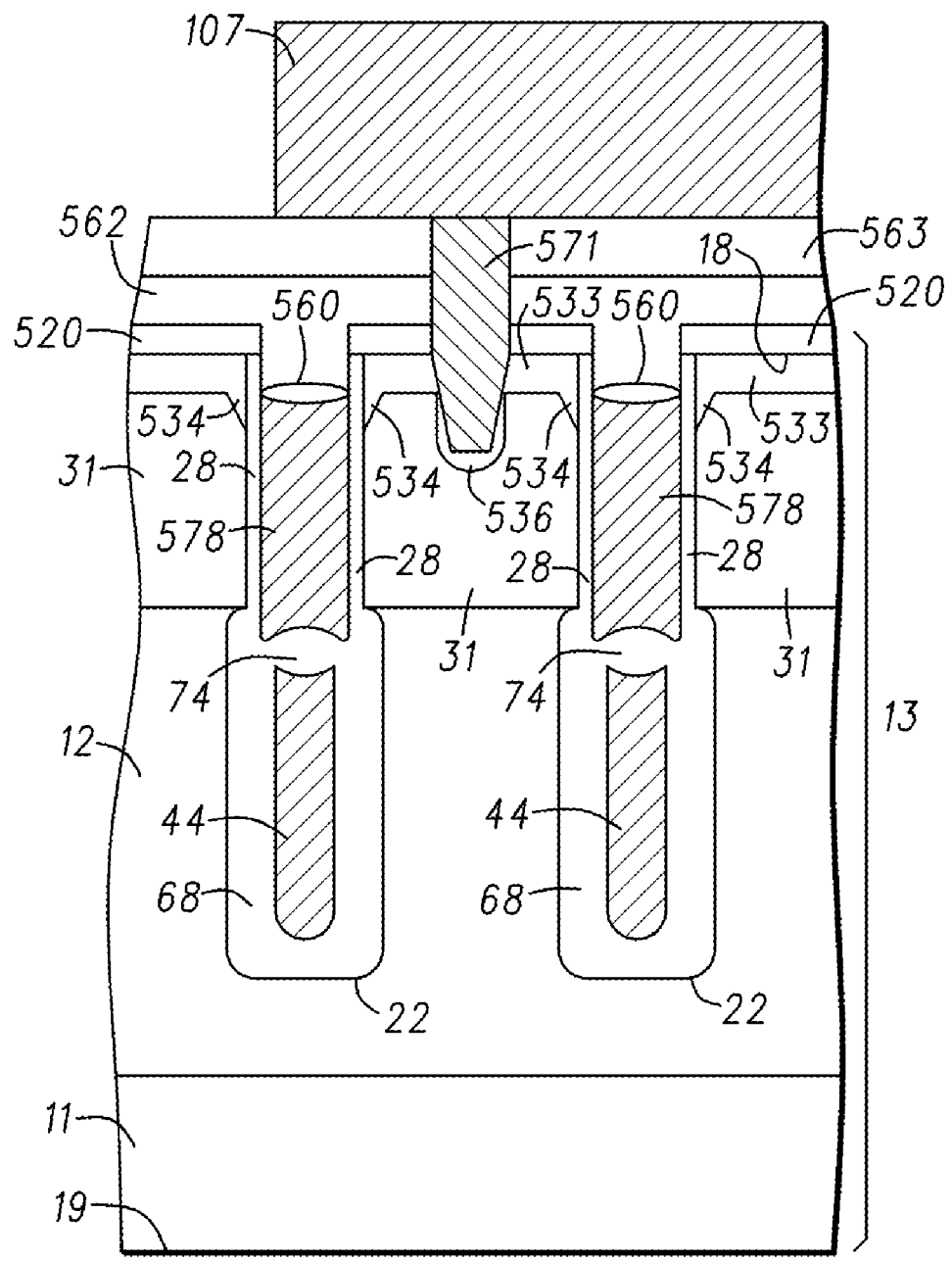

FIG. 23 shows transistor 500 after further processing. After enhancement regions 560 are formed, an ILD layer 562 is formed overlying semiconductor substrate 13 and within recessed portions 588. In one embodiment, a passivation layer 563 is then formed overlying ILD layer 562. A photoresist layer (not shown) is formed overlying semiconductor substrate 13 and patterned to form contact openings, holes, or vias extending through passivation layer 563 and ILD layer 562 to expose a segment of major surface 18 adjoining source regions 533. The photoresist layer then removed and portions of semiconductor layer 12 are removed to form recessed portions extending through source regions 533 and into body region 31. In one embodiment, the recessed portions are formed using a dry etch process with an $SF_6/O_2$ chemistry. Alternatively, an HBr/Cl chemistry is used.

P-type dopant is then ion implanted into body region 31 through the recessed portions to form contact enhancement regions 536. In one embodiment, a boron ion implant or a series of boron ion implants is/are used to form contact enhancement regions 536. By way of example when a single implant is used, an implant dose of about $1.0\times10^{14}$ atoms/cm$^2$ to about $2.0\times10^{15}$ atoms/cm$^2$ is used. Next, the implanted dopant is annealed.

A conventional plug deposition and planarization process is then used to form plug contact structures 571, which fill the recessed portions and extend to an upper surface of passivation layer 563. Conductive layer 107 is then formed overlying semiconductor substrate 13 as described in the conjunction with FIG. 17 above.

Figure 24:
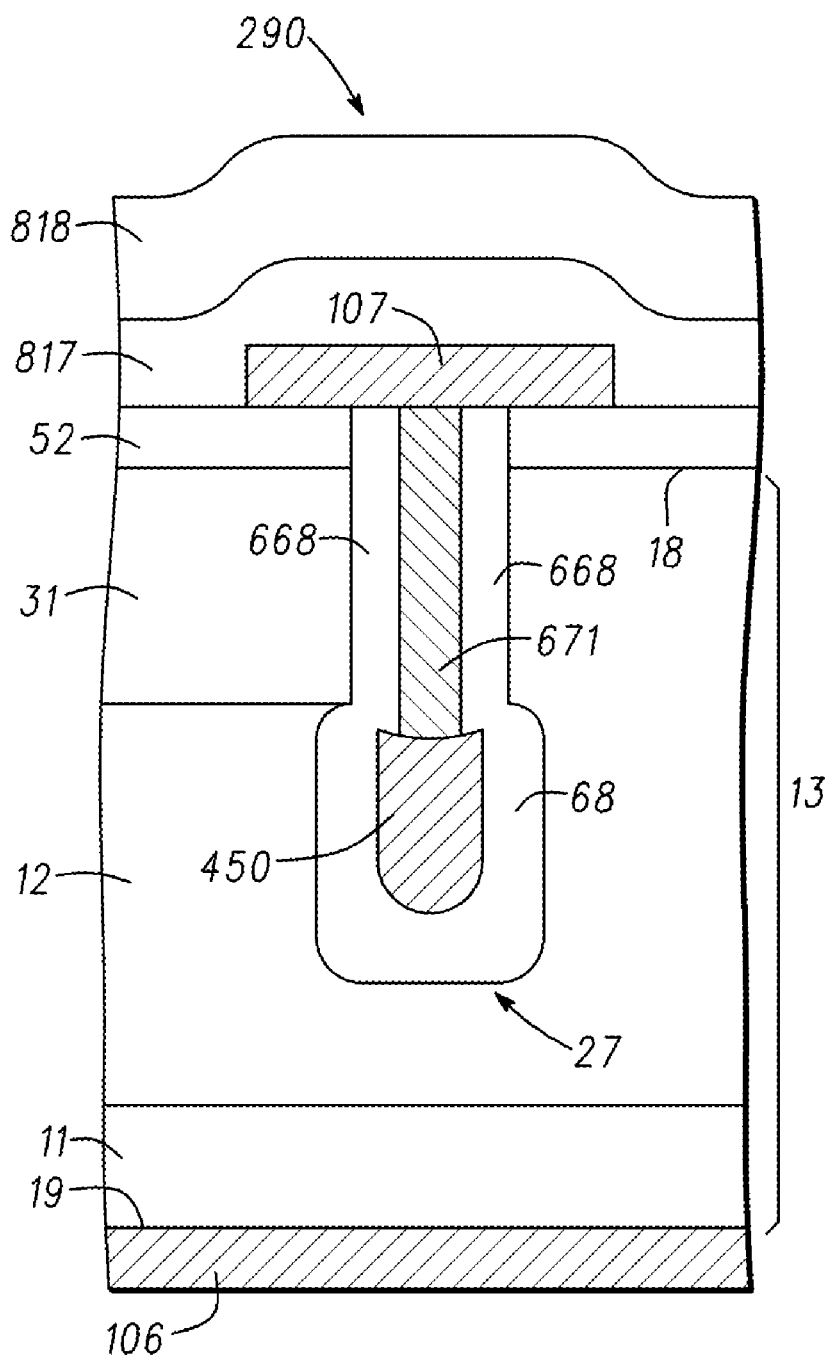
FIG. 24 illustrates a partial cross-sectional view of an alternative embodiment of a shield electrode contact structure.

FIG. 24 shows a partial cross-sectional view of an embodiment of a shield electrode contact structure 600, which is formed in termination region 290. Shield electrode contact structure 600 is suitable for use, for example, with transistors 10 and 500. In forming contact structure 600, photoresist layer 71 (described in FIG. 10) is not formed over trench 27, and the conductive material is etched back to form recessed contact layer 450 in the lower portion of trench 27. Trench 27 is then filled with dielectric layer 668. A via 641 is then etched in dielectric layer 668, and a plug contact structure 671 is used to electrically connect contact layer 450 to conductive layer 107. A conventional plug deposition and planarization is used to form plug contact structure 671. As shown, plug contact structure 671 is a deep plug that extends from major surface 18 to a depth below the depth of body region 31. One feature of shield electrode contact structure 600 is that plug contact structure 671 provides a low resistance conduction path between conductive layer 107 and contact layer 450, which improves device performance.

In view of all of the above, it is evident that a novel method is disclosed for forming a transistor having insulated shield electrode regions and insulated gate electrode regions. Included, among other features, is using a disposable dielectric layer of one material to form dielectric plugs or caps of a different material that overlie the insulated gate electrode regions. The disposable dielectric layer is removed and spacers are formed adjacent the dielectric plugs. Further included is using the spacers to form recessed portions in the transistor to provide contact to source regions and enhancement regions. The disposable dielectric layer or structure and dielectric plugs enable high density transistor geometries with insulated shield electrodes, and enables the use of salicide enhancement regions within the conductive gate electrodes. In a further embodiment, the method includes the formation of an integrated Schottky device.

While the subject matter of the invention is described with specific preferred embodiments, it is evident that many alternatives and variations will be apparent to those skilled in the semiconductor arts. More specifically the subject matter of the invention has been described for a particular N-channel MOS transistor structure on a silicon substrate, although the method is directly applicable to other transistors formed on other semiconductor materials, as well as to BiCMOS, metal semiconductor FETs (MESFETs), HFETs, IGBTs, and other transistor structures.

What is claimed is:

1. A method of forming a semiconductor device comprising the steps of: providing a semiconductor substrate having a major surface; forming a dielectric stack overlying the major surface, wherein the dielectric stack comprises a first layer and second layer overlying the first layer, and wherein one layer comprises an oxidation blocking layer; forming a first opening in the dielectric stack; forming a trench in the semiconductor substrate through the opening and extending from the major surface; forming an insulated shield electrode within the trench; removing the second layer; forming an insulated gate electrode within the trench, wherein the insulated gate electrode includes a conductive gate material; removing a portion of the conductive gate material to form a first recessed region above the insulated gate electrode; forming a dielectric plug within the first recessed region, wherein the dielectric plug comprises a material different than the first layer; forming a body region in the semiconductor substrate; removing the first layer; forming a source region in the body region self-aligned to the dielectric plug; forming dielectric spacers adjacent the dielectric plug; forming second recessed regions in the semiconductor substrate self-aligned to the spacers; and forming a first conductive layer coupled to the semiconductor substrate through the second recessed regions.

2. The method of claim 1, wherein the step of forming the insulated shield electrode comprises the steps of:
    forming a first dielectric layer overlying surfaces of the trench, wherein the first dielectric layer has a first thickness;
    forming a second dielectric layer overlying the first dielectric layer, wherein the first dielectric layer and the second dielectric layer comprise different materials;
    forming a second opening along lower portions of the trench through the first and second dielectric layers;
    forming the trench to a second depth greater than the first depth through the second opening to a form shield electrode trench portion;
    forming a third dielectric layer along surfaces of the shield electrode trench portion, wherein the third dielectric layer has a second thickness;
    forming a shield electrode overlying the third dielectric layer, wherein the shield electrode is recessed within the trench; and
    forming a fourth dielectric layer overlying the shield electrodes.

3. The method of claim 2, wherein the step of forming the third dielectric layer includes forming the third dielectric layer, wherein the second thickness is greater than the first thickness.

4. The method of claim 2, wherein the step of forming the first dielectric layer includes forming an oxide layer, and wherein the step of forming the second dielectric comprises forming a nitride layer.

5. The method of claim 2, wherein the step of forming the insulated gate electrode comprises the steps of:
    removing portions of the second dielectric layer after the step of forming the fourth dielectric layer; and
    forming the gate conductive material overlying the fourth and first dielectric layers.

6. The method of claim 1, wherein the step of forming the first layer includes forming an oxide layer, and wherein the step of forming the second layer includes forming a nitride layer.

7. The method of claim 6, wherein the step of forming the dielectric plug includes forming dielectric plug comprising nitride.

8. The method of claim 7, wherein the step of forming the spacers includes forming oxide spacers.

9. The method of claim 1, further comprising the step of forming a first enhancement region in the first recessed region.

10. The method of claim 9, wherein the step of forming the first enhancement region includes forming a silicide region.

11. The method of claim 1, further comprising the step of forming a second enhancement region in the second recessed region.

12. The method of claim 1, wherein the step of forming the body region includes forming the body region after the step of forming the trench.

13. A method for forming a semiconductor device comprising the steps of:
    providing a semiconductor substrate having a major surface, a pair of adjacent trenches, and a dielectric stack overlying the major surface between the pair of adjacent trenches, wherein the dielectric stack includes at least a first layer and a second layer comprised of different materials;

forming insulated shield electrodes in portions of the pair of adjacent trenches;
removing the second layer;
forming insulated gate electrodes in other portions of the pair of adjacent trenches, wherein the insulated gate electrodes include conductive gate material having a surface in proximity to an upper surface of the first layer;
removing portions of the conductive gate material to form first recessed regions;
forming dielectric plugs in the first recessed regions;
removing at least portions of the first layer;
forming spacers adjacent the dielectric plugs;
removing a portion of the semiconductor substrate self-aligned to the spacers to form a second recessed region;
forming first enhancement regions in the second recessed region; and
forming a conductive layer overlying the dielectric plugs.

14. The method of claim 13 further comprising the steps of:
forming a body region in the semiconductor substrate; and
forming a source region in the body region self-aligned to the dielectric plug.

15. The method of claim 13, wherein the step of providing the semiconductor substrate includes providing a semiconductor substrate wherein the first layer is an oxide and the second layer is a nitride layer, and wherein the step of forming the dielectric plugs includes forming nitride plugs.

16. The method of claim 15 further comprising the step of forming second enhancement regions in the first recessed regions before the step of forming the dielectric plugs.

17. The method of claim 16, wherein the step of forming the second enhancement regions includes forming silicide regions.

18. A method for forming a semiconductor device comprising the steps of:
providing a semiconductor substrate having a major surface, a pair of adjacent trenches, and a dielectric stack overlying the major surface between the pair of adjacent trenches, wherein the dielectric stack includes at least a first layer and a second layer comprised of different materials;
forming insulated shield electrodes in portions of the pair of adjacent trenches;
removing the second layer;
forming insulated gate electrodes in other portions of the pair of adjacent trenches, wherein the insulated gate electrodes include conductive gate material having a surface in proximity to an upper surface of the first layer;
removing portions of the conductive gate material to form first recessed regions;
forming first enhancement regions in portions of the conductive gate material;
forming dielectric plugs in the first recessed regions;
removing at least portions of the first layer;
forming spacers along sidewalls of the dielectric plugs;
removing a portion of the semiconductor substrate self-aligned to the spacers to form a second recessed region; and
forming a conductive layer coupled to the semiconductor substrate within the second recessed region.

19. The method of claim 18 further comprising the steps of:
forming a body region in the semiconductor substrate; and
forming at least one source region in the body region self-aligned to a dielectric plug.

20. A method for forming a semiconductor device comprising the steps of:
providing a semiconductor substrate having a major surface;
forming a first trench portion extending from the major surface to a first depth;
forming a gate dielectric layer overlying the first trench portion, wherein the first trench portion and gate dielectric layer have a first lateral dimension, and wherein the step of forming the gate dielectric layer establishes a gate length for the semiconductor device;
forming a first dielectric layer overlying the gate dielectric layer;
forming an opening at the bottom of the first trench portion;
forming a second trench portion through the opening to a second depth greater than the first depth;
forming a second dielectric layer overlying surfaces of the second trench portion, wherein the second trench portion and the second dielectric layer have a second lateral dimension that is greater than the first lateral dimension;
forming a shield electrode overlying the second dielectric layer and recessed within the second trench portion;
forming a third insulating layer overlying the shield electrode;
removing the first dielectric layer; and
forming a gate electrode within the first trench portion, wherein the gate electrode is recessed within the first trench portion.

21. The method of claim 20 further comprising the step of forming a dielectric plug overlying the gate electrode.

* * * * *